(12) United States Patent
Wang et al.

(10) Patent No.: US 6,638,871 B2
(45) Date of Patent: Oct. 28, 2003

(54) METHOD FOR FORMING OPENINGS IN LOW DIELECTRIC CONSTANT MATERIAL LAYER

(75) Inventors: Chin-Jung Wang, Hsinchu (TW); Tong-Yu Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 81 days.

(21) Appl. No.: 10/044,322

(22) Filed: Jan. 10, 2002

(65) Prior Publication Data

US 2003/0129842 A1 Jul. 10, 2003

(51) Int. Cl.[7] .............................................. H01L 21/311
(52) U.S. Cl. ..................... 438/694; 438/700; 438/717
(58) Field of Search ................................. 438/694, 700, 438/702, 717, 720, 724, 725

(56) References Cited

U.S. PATENT DOCUMENTS

| | | | |
|---|---|---|---|
| 6,017,817 A | * | 1/2000 | Chung et al. ............... 438/637 |
| 6,197,681 B1 | * | 3/2001 | Liu et al. ..................... 438/637 |
| 6,309,955 B1 | * | 10/2001 | Subramanian et al. ....... 438/618 |
| 6,350,700 B1 | * | 2/2002 | Schinella et al. ............ 438/723 |
| 6,372,653 B1 | * | 4/2002 | Lou et al. .................... 438/706 |
| 6,399,478 B2 | * | 6/2002 | Matsubara et al. .......... 438/623 |
| 6,455,409 B1 | * | 9/2002 | Subramanian et al. ....... 438/618 |
| 2003/0044725 A1 | * | 3/2003 | Hsue et al. .................. 430/314 |

* cited by examiner

Primary Examiner—Kin-Chan Chen
(74) Attorney, Agent, or Firm—Charles C. H. Wu; Wu & Cheung, LLP

(57) ABSTRACT

The invention is directed towards a method for forming openings in low-k dielectric layers. A cap layer, a low-k dielectric layer, a metal hard mask layer and a hard mask layer are formed in sequence on a provided substrate with metal wires. After patterning the metal hard mask layer and the hard mask layer to form a first opening, a fluid filling material layer is formed on the hard mask layer and fills the first opening. Using a patterned photoresist layer as a mask to define the filling material layer and the low-k dielectric layer, a second opening is obtained. After removing the photoresist layer along with the filling material layer, a damascene opening is formed by using the metal hard mask and the hard mask layers as a mask and the cap layer as an etching stop layer.

20 Claims, 6 Drawing Sheets

METHOD FOR FORMING OPENINGS IN LOW DIELECTRIC CONSTANT MATERIAL LAYER

BACKGROUND OF THE INVENTION

1. Field of Invention

The present invention relates to a method for manufacturing semiconductor devices. More particularly, the present invention relates to a method for forming openings in low-k dielectric material layers.

2. Description of Related Art

In the semiconductor fabrication process, as the dimension of devices on a chip becomes smaller, the density of interconnect pitch becomes higher. Because widely used silicon oxide dielectric layers have high dielectric constants, it can easily result in high RC delay. Therefore, low dielectric constant (low-k) dielectric material is used instead as an inter-metal dielectric (IMD) in high speed ICs. To apply low k dielectric has the advantage such as reducing the interconnection parasitic capacitance, consequently reducing the RC delay, or mitigating the cross talk between metal lines, hence, the operation speed is improved. Hence, the low k dielectric material is a very popular IMD material used in high speed ICs.

The low k dielectric materials include inorganic materials, such as HSQ, FSG and CORAL, and organic materials, such as flare, SILK and parylene.

In the conventional via-first process for forming damascene opening, as shown in FIG. 1, a cap nitride layer 102 is formed over metal interconnects (not shown) within a provided substrate 100. Afterwards, a first low-k dielectric layer 104, a stop layer 106, a second low-k dielectric layer 108, a chemical mechanical polishing (CMP) stop layer 110 and a bottom anti-reflection coating (BARC) layer (not shown) are formed in sequence on the cap nitride layer. Then, a patterned first photoresist layer is formed on the BARC layer for defining vias. By using the first photoresist layer as a mask and the cap nitride layer is used as an etching stop layer, a first anisotropic etching process is performed through the layers to form a via opening.

After removing the first photoresist layer, a gap filling process is performed to fill the via with a polymer material layer to protect the cap nitride layer. After a patterned second photoresist layer is formed on the polymer material layer, a second anisotropic etching process is performed to define a trench, by using the stop layer as an etching stop layer. FIG. 1 shows a prior-art damascene opening structure manufactured by the cited above process.

However, the polymer material layer covering the via opening provokes a fence profile 110 around top of the opening 120, as shown in FIG. 1. It is because the polymer material layer hinders the etching, resulting in incomplete removal of the second low-k dielectric layer 108.

Furthermore, while the second photoresist layer is subsequently stripped by a photoresist removal process, such as a nitrogen/oxygen plasma ashing process or a nitrogen/hydrogen plasma process, the performed photoresist removal process usually damages the side walls 107 of the second dielectric layer 108, leading to dielectric constant shift of the low-k dielectric layer. Moreover, the low-k dielectric material of the damaged sidewalls 107 tends to absorb moisture, resulting in degradation in the follow-up metallization process.

SUMMARY OF THE INVENTION

It is therefore an object of the invention to provide a method for forming openings in low-k dielectric material layer. The disadvantage of photoresist striping by plasma is improved, and no fence profile is provoked. Therefore, it is more advantageous for the fabrication for forming openings in low-k material layers, especially the low-k material layers containing metal wires or interconnects.

To achieve these objects and advantages, and in accordance with the purpose of the invention, as embodied and broadly described herein, the invention is directed towards a method for forming openings in low-k dielectric layers, A cap layer, a first dielectric layer, an etch stop layer, a second dielectric layer, a CMP stop layer, a metal hard mask layer, a hard mask layer and a BARC layer are formed in sequence on a provided substrate with metal wires. The first and second dielectric layers are low-k dielectric layers. Afterwards, a patterned first photoresist layer is formed on the BARC layer to define the BARC layer, the hard mask layer and the metal hard mask layer to form a first opening. Then, the first photoresist layer 220 is removed along with the BARC layer. Next, a BARC material layer is formed, acting as an anti-reflection layer and filling the first opening. Using a patterned second photoresist layer formed on the BARC material layer as a mask, a second opening is defined. After removing the second photoresist layer along with the BARC material layer, a damascene opening is formed by using the metal hard mask and the hard mask layers as a mask. Afterwards, the cap layer is removed and the dual damascene interconnect structure is completed.

By using the patterned hard mask layer and the patterned metal hard mask layer as a mask along with the gap-filling BARC material layer, the low-k dielectric layers are protected from plasma damage for stripping the photoresist. While the sidewalls of the second opening might be damaged during the photoresist stripping process, the damaged sidewalls will be removed during the following anisotropic etching process, thus avoiding degradation.

Moreover, no gap filling process is required for the via opening, thus avoiding the fence profiles.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A–2I are cross-sectional views of the process steps for forming a damascene opening in low-k material layers according to one preferred embodiment of this invention.

DESCRIPTION OF THE PREFERRED EMBODIMENTS

FIGS. 2A–2I are cross-sectional views of the process steps for forming a damascene opening in low-k material layers according to one preferred embodiment of this invention.

Figure 1:
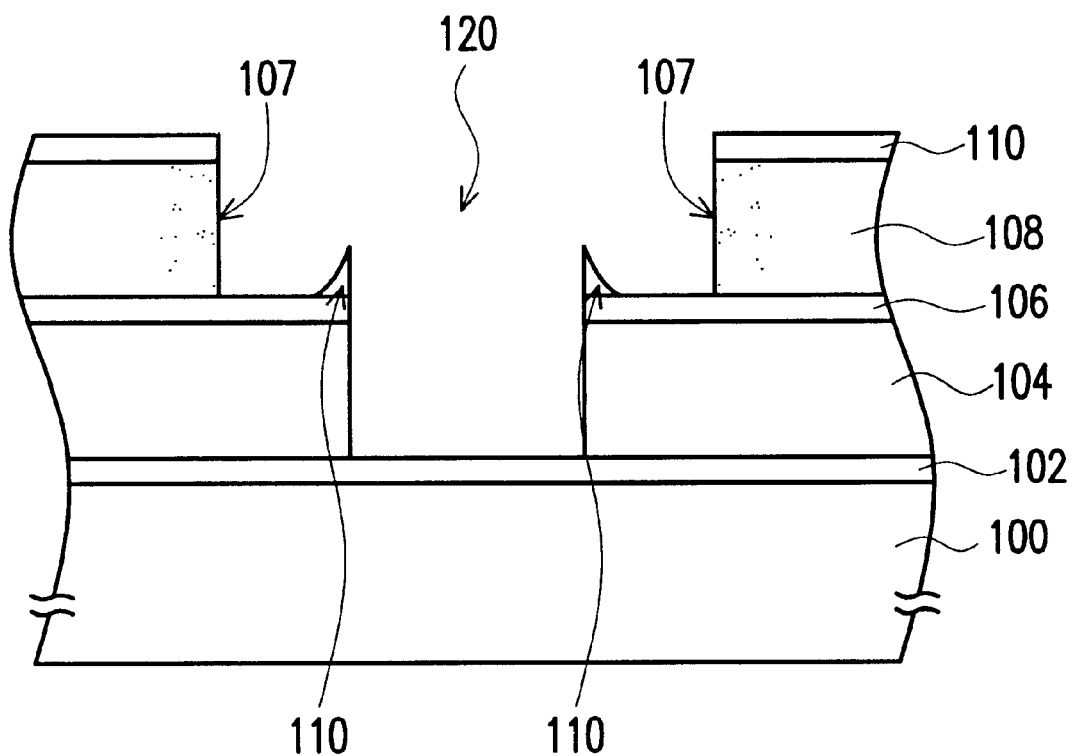
FIG. 1 shows a prior art damascene opening structure manufactured by the conventional via-first process for forming damascene openings.
Figure 2A:
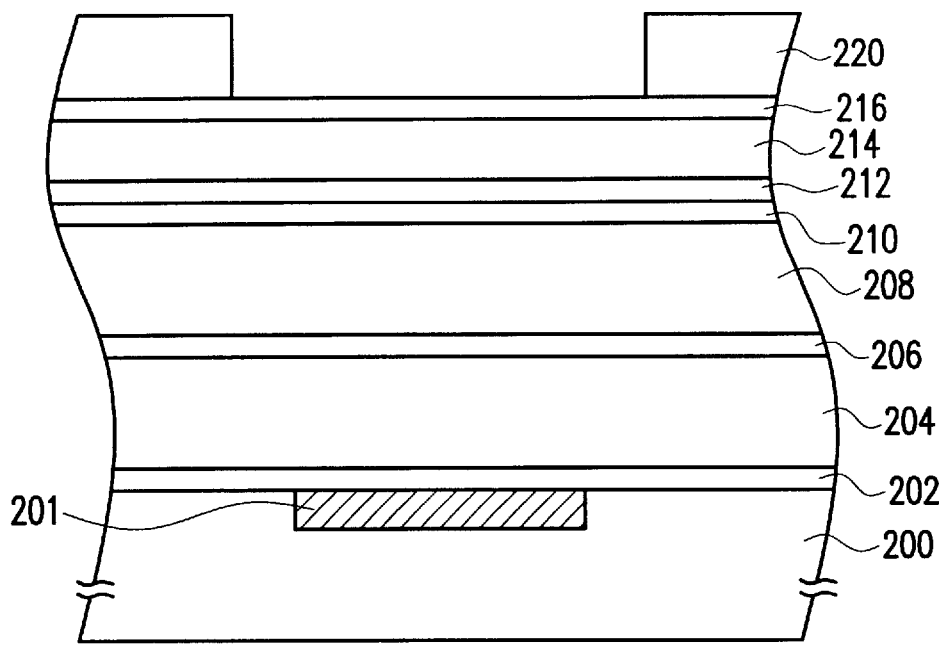

Referring to FIG. 2A, a semiconductor substrate 200 having metal wires 201 formed thereon is provided. A cap layer 202 is formed over the substrate 200 and the metal wires 201. The cap layer is, for example, a nitride layer with a thickness of about 400–700 Å, preferably 500 Å. Afterwards, a first dielectric layer 204, an etch stop layer 206 and a second dielectric layer 208 are formed in sequence on the cap nitride layer 202. The first and second dielectric layers 202, 208 are low-k dielectric layers made of, for example, an inorganic polymer containing silicon, such as CORAL™ or Black Diamond™. The first and second dielectric layers 202, 208 are formed by, for example, CVD with a thickness of about 2000 Å to 3000 Å. The thickness of the dielectric layers is adjustable, depending on the structure formed on the substrate 200. The etch stop layer 206 is, for example, a silicon nitride layer or a silicon carbide layer with a thickness of about 400–700 Å, preferably 500 Å.

Afterwards, a chemical mechanical polishing (CMP) stop layer 210, a metal hard mask layer 212, a hard mask layer 214 and a bottom anti-reflection coating (BARC) layer 216 are formed in sequence on the second dielectric layer 208. The CMP stop layer 210 is, for example, a silicon nitride layer or a silicon carbide layer with a thickness of about 400–700 Å, preferably 500 Å. Materials for forming the metal hard mask layer 212 includes tantalum, tantalum nitride, tungsten, tungsten nitride, titanium nitride and titanium, formed by, for example, CVD or sputtering. The metal hard mask layer 212 has a thickness of about 100–300 Å, preferably 200 Å. The hard mask layer 214 is, for example, a silicon nitride layer or a silicon carbide layer with a thickness of about 1000–2000 Å, preferably 1500 Å. The formation of the metal hard mask layer and the hard mask layer is one of the advantageous features of the present invention. Afterwards, a patterned first photoresist layer 220 is formed on the BARC layer 216.

Figure 2B:
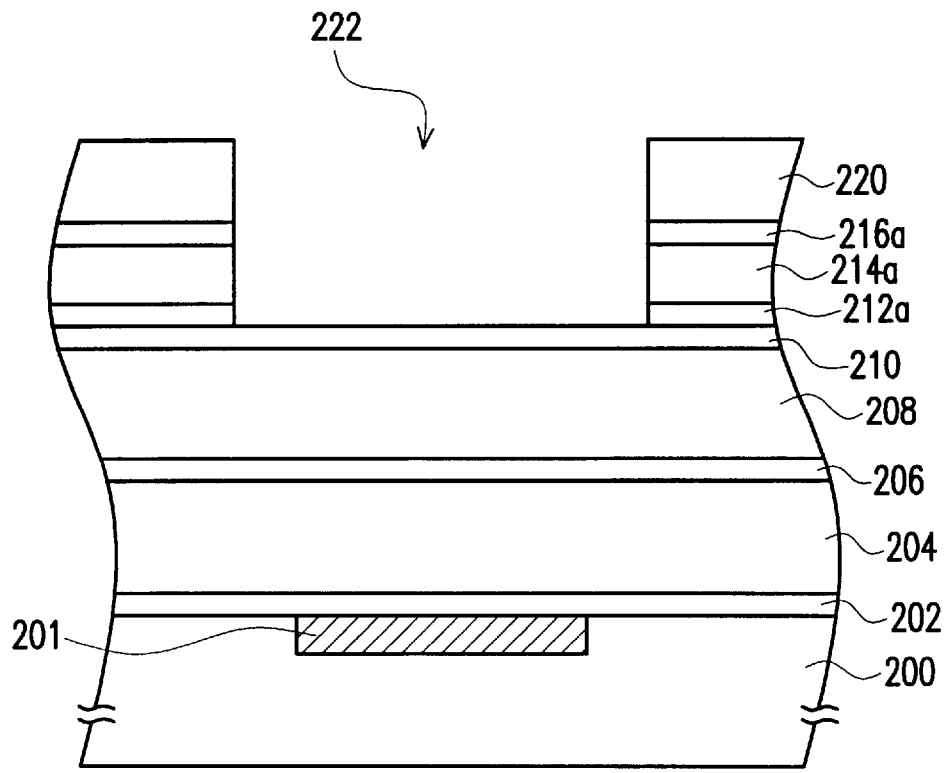

Referring to FIG. 2B, using the patterned photoresist layer 220 as a mask, the BARC layer 216, the hard mask layer 214 and the metal hard mask layer 212 are partially removed until the CMP stop layer 210 is exposed. An opening 222 is thus formed within the BARC layer 216a, the patterned hard mask layer 214a and the metal hard mask layer 212a.

Figure 2C:
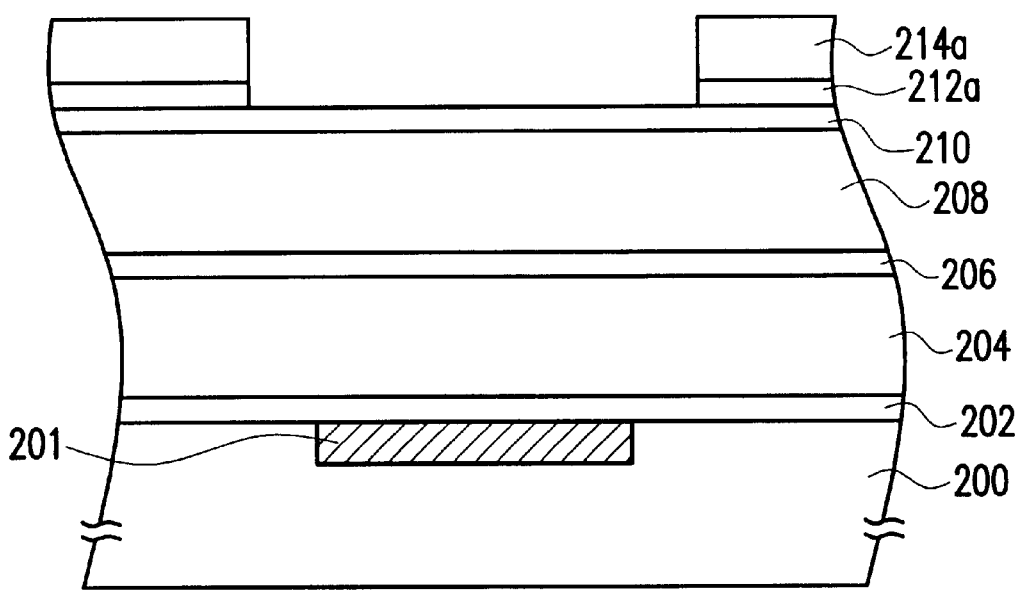

Referring to FIG. 2C, using plasma as a clean agent, the first photoresist layer 220 is removed. Because the material of the BARC layer 216 is similar to the material of the photoresist layer 220, the BARC layer 216a is removed along with the first photoresist layer 220. Because the dielectric layers 202, 208 are protected by the CMP stop layer and not exposed to plasma, damage is thus avoided.

Figure 2D:
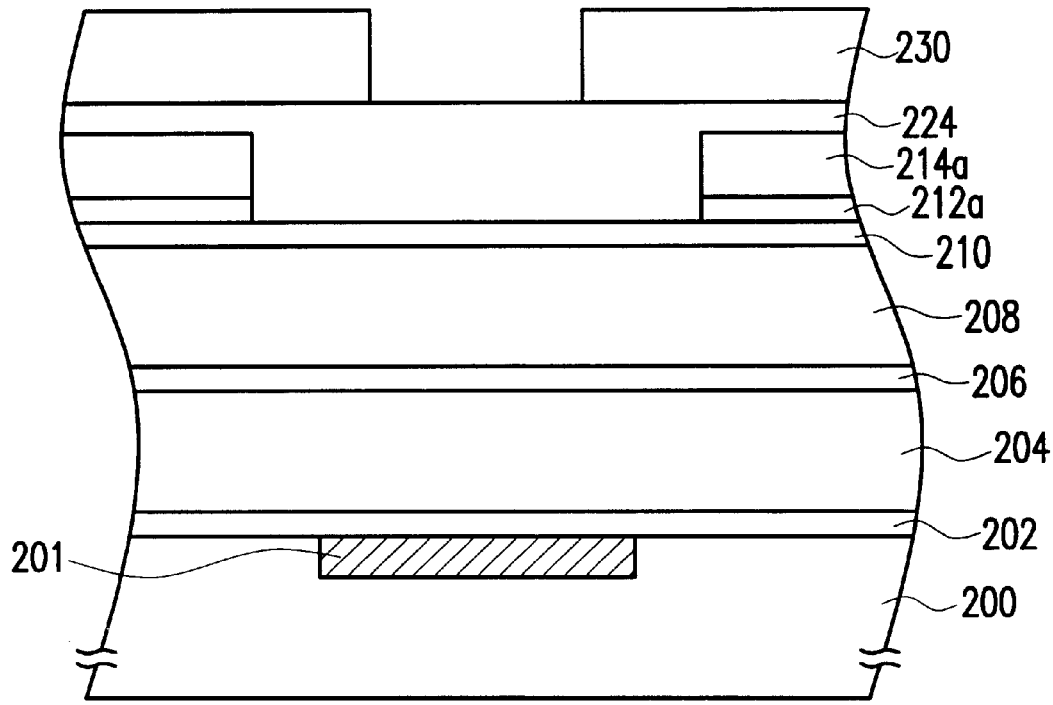

Referring to FIG. 2D, a BARC material layer 224 is formed by, for example, spin-on, on the patterned hard mask layer 214a and fill the opening 222. The material for the BARC material layer 224 can be, for example, fluid organic polymer, similar to the photoresist materials but without photosensitivity. The BARC material layer can act as an anti-reflection layer and fill the opening. Afterwards, a patterned second photoresist layer 230 is formed on the BARC material layer 224.

Figure 2E:
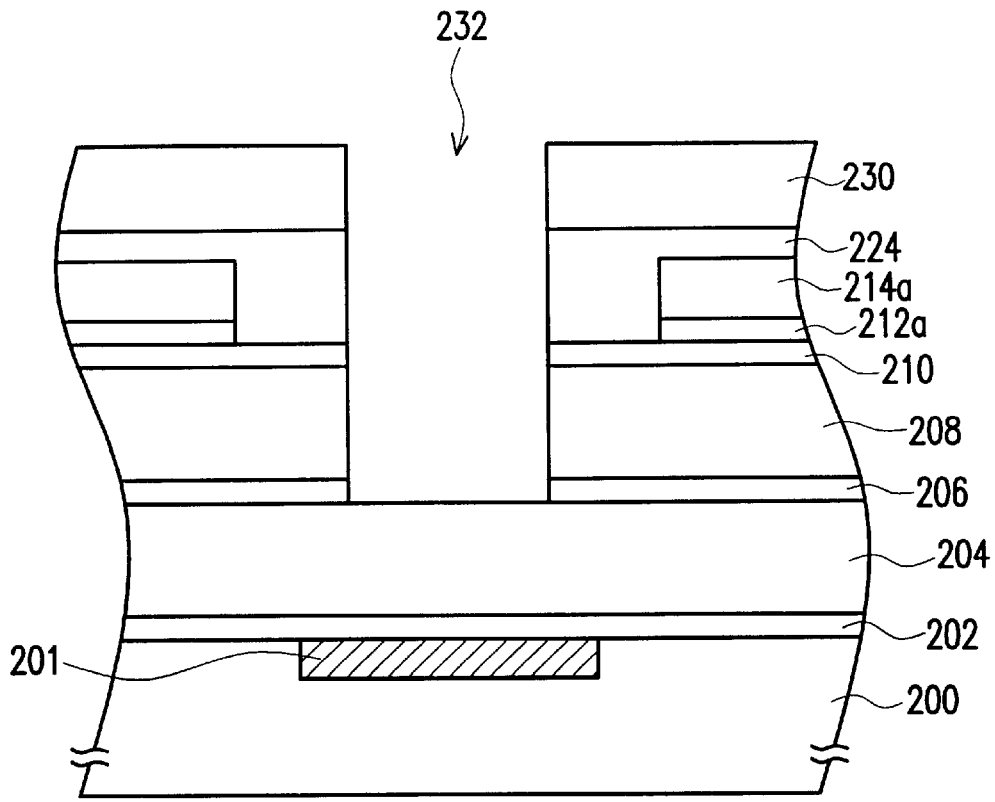

Referring to FIG. 2E, using the second photoresist layer 230 as a mask, a first anisotropic etching process is performed to remove the BARC material layer 224, the CMP stop layer 210, the second dielectric layer 208 and the etch stop layer 206, forming a via opening 232. The depth of the via opening 232 is adjustable, depending on the process needs. That is, the anisotropic etching can stop before, right at or after the etch stop layer 206, but without exposing the cap layer 202 and the metal wires.

Figure 2F:
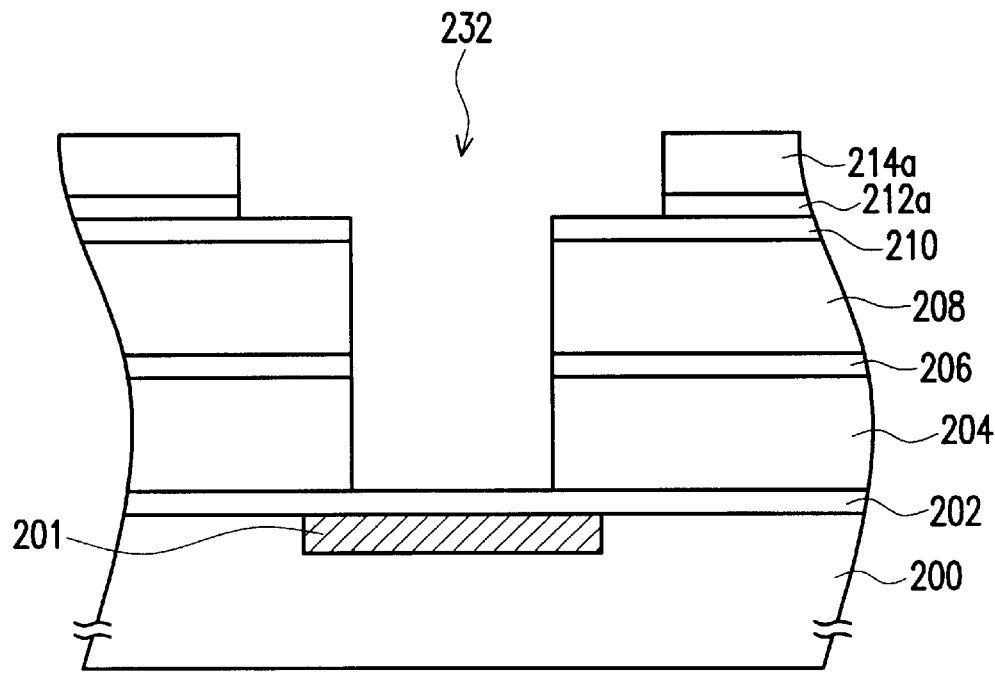

Referring to FIG. 2F, a plasma process is performed to remove the second photoresist layer 230. Because the material of the BARC material layer 224 is similar to the material of the photoresist layer 230, the BARC material layer 224 is removed along with the second photoresist layer 230.

Figure 2G:
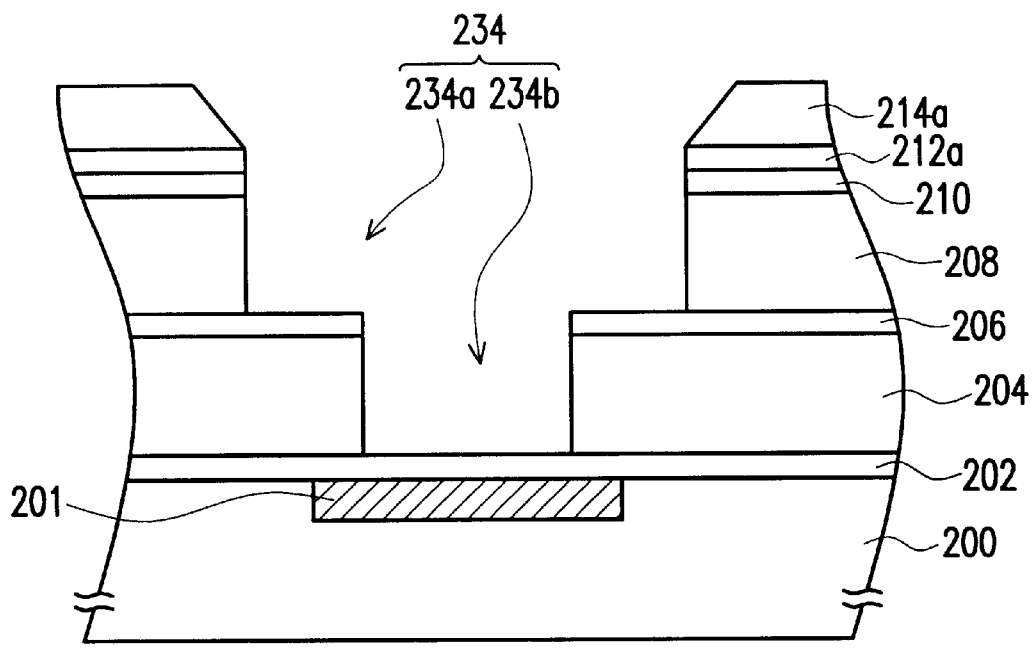

Referring to FIG. 2G, using the hard mask layer 214a and the metal hard mask layer 212a as a mask, a second anisotropic etching process is performed to form a damascene opening 234. The damascene opening 234 includes a trench opening 234a and a via opening 234b. By controlling the depth of the via opening 232 and the etching conditions, the trench opening 234a is etched until the etch stop layer 206 is exposed, while the via opening 234b is formed by using the cap layer 202 as an etch stop layer.

Figure 2H:
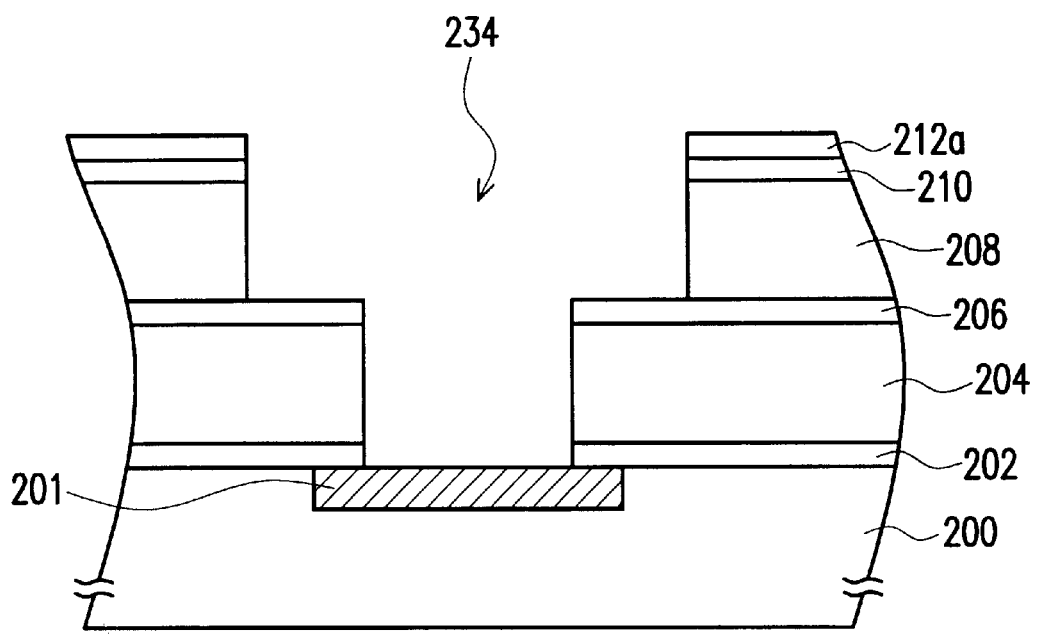
Figure 21:
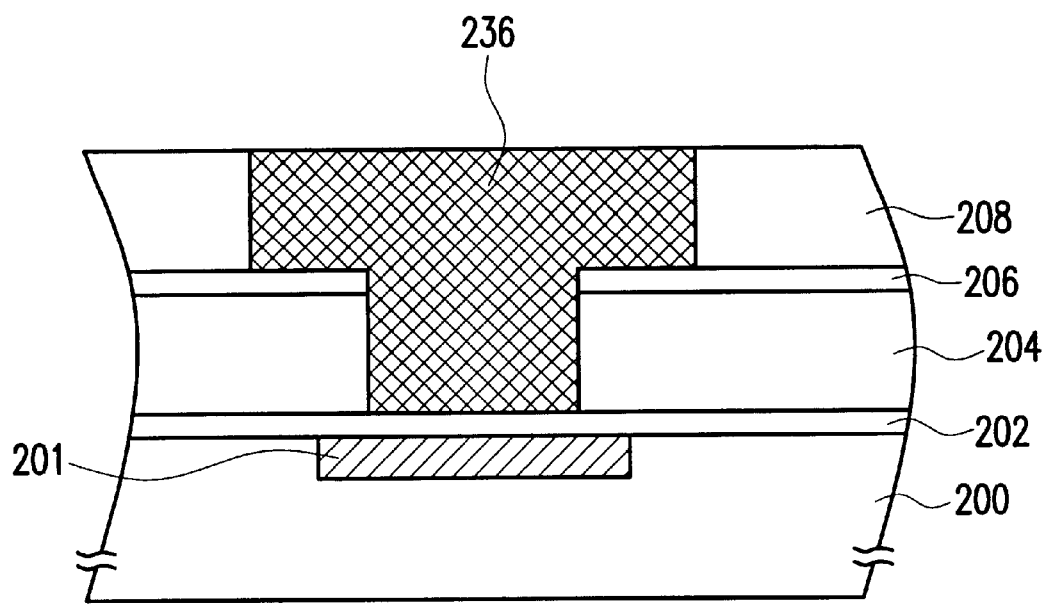

Although sidewalls of the via opening 232 is exposed to plasma damage for stripping the photoresist, the damaged sidewalls of the via opening 232 is removed during the second anisotropic etching process. Referring to FIG. 2H, the cap layer 202 is removed to expose the underlying metal wires 201 within the substrate 200. The cap layer 202 can be removed either by wet etching or dry etching. If the hard mask layer 214a is made of the same material as the cap layer 202, for example, silicon nitride, the hard mask layer 214a is removed along with the cap layer 202.

Afterwards, a conductive layer (not shown) is formed to fill the damascene opening 234. The material for forming the conductive layer includes aluminum, copper or other metals formed by sputtering or CVD. The conductive layer is then planarized by CMP using the CMP stop layer 210 as a polishing stop layer, so that a damascene interconnect 236 His formed within the opening 234, as shown in FIG. 2I. The metal hard mask layer 212a and the CMP stop layer 210 are removed during the CMP process.

The following processes are well known to persons skilled in the art, and will not be further described therein.

By using the patterned hard mask layer and the patterned metal hard mask layer as a mask along with the gap-filling BARC material layer, the low-k dielectric layers are protected from plasma damage for stripping the photoresist. Moreover, no gap filling process is required for the via opening, thus avoiding the fence profile.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming openings in low-k dielectric material layers, comprising:

providing a substrate containing a metal wire;

forming a cap layer, a first dielectric layer, a first stop layer, a second dielectric layer, a second stop layer, a metal hard mask layer, a hard mask layer and an anti-reflection layer sequentially on the substrate, wherein the first and second dielectric layers are low-k dielectric layers;

forming a patterned first photoresist layer on the anti-reflection layer to define the anti-reflection layer, the hard mask layer and the metal hard mask layer, so that a first opening is formed to expose the first stop layer;

removing the first photoresist layer along with the anti-reflection layer;

forming a filling material layer on the hard mask layer to fill the first opening;

forming a patterned second photoresist layer on the filling material layer to define the filling material layer, the second stop layer, the second dielectric layer and the first stop layer, so that a second opening is formed to expose the first dielectric layer;

removing the second photoresist layer along with the filling material layer;

performing an anisotropic etching step to form a damascene opening by using the metal hard mask and the hard mask layers as a mask, wherein the damascene opening expose the cap layer; and removing the exposed cap layer to expose the underlying metal wire.

2. The method as claimed in claim 1, wherein the damascene opening includes a trench opening and a via opening, and the first stop layer and the cap layer are respectively used as etch stop layers for forming the trench opening and the via opening.

3. The method as claimed in claim 1, wherein the materials for forming the first and second dielectric layers include inorganic polymer containing silicon.

4. The method as claimed in claim 1, wherein the anti-reflection layer is a bottom anti-reflection coating layer.

5. The method as claimed in claim 1, wherein the filling material layer is a bottom anti-reflection coating layer made of fluid organic polymer.

6. The method as claimed in claim 1, wherein the metal hard mask layer is made of one of the following materials selected from the group consisting of tantalum, tantalum nitride, titanium, titanium nitride, tungsten and tungsten nitride.

7. The method as claimed in claim 1, wherein the first stop layer can be a silicon nitride layer or a silicon carbide layer.

8. The method as claimed in claim 1, wherein the second stop layer can be a silicon nitride layer or a silicon carbide layer.

9. The method as claimed in claim 1, wherein the hard mask layer can be a silicon nitride layer or a silicon carbide layer.

10. The method as claimed in claim 1, further comprising forming a dual damascene interconnect structure is formed within the damascene opening, after removing the exposed cap layer.

11. The method as claimed in claim 10, the step of forming a dual damascene interconnect structure within the damascene opening comprising:

forming a conductive layer to fill the damascene opening; and planarizing the conductive layer to form the dual damascene interconnect structure within the damascene opening by chemical mechanical polishing using the second stop layer as a polishing stop layer.

12. A method for forming a damascene structure in low-k dielectric layers, comprising:

providing a substrate containing at least one metal wire therein, wherein a cap layer and a low-k dielectric layer are formed in sequence over the substrate;

forming a metal hard mask layer and a hard mask layer sequentially on the low-k dielectric layer;

patterning the metal hard mask layer and the hard mask layer to form a first opening;

forming a filling material layer on the patterned hard mask layer to fill the first opening;

forming a patterned photoresist layer on the filling material layer;

using the patterned photoresist layer as a mask to etch the filling material layer and the low-k dielectric layer, wherein the low-k dielectric layer is etched to a predetermined depth without exposing the cap layer;

removing the photoresist layer along with the filling material layer;

using the patterned metal hard mask layer and the patterned hard mask layer as a mask and the cap layer is used as an etch stop layer to etch the low-k dielectric layer, in order to form a damascene opening;

removing the cap layer exposed by the damascene opening;

forming a conductive layer to fill the damascene opening; and planarizing the conductive layer to form a damascene interconnect structure within the damascene opening by chemical mechanical polishing.

13. The method as claimed in claim 12, wherein a stop layer is further included within the low-k dielectric layer, and wherein the stop layer can act as an etching stop layer while the low-k dielectric layer is etched to the predetermined depth without exposing the cap layer.

14. The method as claimed in claim 13, wherein the stop layer can be a silicon nitride layer or a silicon carbide layer.

15. The method as claimed in claim 12, wherein a hard layer is further included between the low-k dielectric layer and the metal hard mask layer, and wherein the hard layer can act as an etching stop layer while the metal hard mask layer and the hard mask layer are patterned.

16. The method as claimed in claim 15, wherein the hard layer can be a silicon nitride layer or a silicon carbide layer.

17. The method as claimed in claim 12, wherein the materials for forming the low-k dielectric layer include inorganic polymer containing silicon.

18. The method as claimed in claim 12, wherein the filling material layer is a bottom anti-reflection coating layer made of fluid organic polymer.

19. The method as claimed in claim 12, wherein the metal hard mask layer is made of one of the following materials selected from the group consisting of tantalum, tantalum nitride, titanium, titanium nitride, tungsten and tungsten nitride.

20. The method as claimed in claim 12, wherein the hard mask layer can be a silicon nitride layer or a silicon carbide layer.

* * * * *